(12) United States Patent
Riesco-Prieto et al.

(10) Patent No.: US 10,277,433 B1
(45) Date of Patent: Apr. 30, 2019

(54) METHOD TO IMPROVE LATENCY IN AN ETHERNET PHY DEVICE

(71) Applicant: Analog Devices Global Unlimited Company, Hamilton (BM)

(72) Inventors: Jacobo Riesco-Prieto, Caceres (ES); Philip Curran, Dublin (IE); Michael McCarthy, Co Limerick (IE)

(73) Assignee: Analog Devices Global Unlimited Company, Hamilton (BM)

( * ) Notice: Subject to any disclaimer, the term of this patent is extended or adjusted under 35 U.S.C. 154(b) by 10 days.

(21) Appl. No.: 15/813,905

(22) Filed: Nov. 15, 2017

(51) Int. Cl.
*H04L 1/00* (2006.01)
*H04L 25/08* (2006.01)
*H04L 25/49* (2006.01)
*H04L 27/00* (2006.01)

(52) U.S. Cl.
CPC .......... *H04L 25/491* (2013.01); *H04L 1/0054* (2013.01); *H04L 25/085* (2013.01); *H04L 27/0014* (2013.01); *H04L 2027/0075* (2013.01)

(58) Field of Classification Search
CPC ..... H04L 27/38; H04L 1/0045; H04L 1/0061; H04L 25/03006; H04L 27/2649; H04L 1/006; H04L 1/1867; H04L 25/0256; H04L 25/03159; H04L 27/14; H04L 27/233; H04L 25/03203
USPC .................................................. 375/341, 262
See application file for complete search history.

(56) References Cited

U.S. PATENT DOCUMENTS

| | | | | |
|---|---|---|---|---|
| 8,332,720 | B2* | 12/2012 | Park ...................... | H03M 13/09 375/341 |
| 2009/0296802 | A1* | 12/2009 | Ermolayev ........... | H04L 1/0054 375/233 |
| 2015/0244499 | A1* | 8/2015 | Alexander ............. | H01Q 23/00 375/341 |

* cited by examiner

*Primary Examiner* — Sam K Ahn
*Assistant Examiner* — Sarah Hassan
(74) *Attorney, Agent, or Firm* — Schwegman Lundberg & Woessner, P.A.

(57) ABSTRACT

This disclosure relates to data communication networks. An example data communication apparatus includes physical (PHY) layer circuitry that includes transceiver circuitry, decoder circuitry, and a signal analysis unit. The transceiver circuitry receives encoded data symbols via a network link. The received encoded data symbols are encoded using trellis coded modulation (TCM). The decoder circuitry decodes the received encoded data symbols using maximum-likelihood (ML) decoding to map a received symbol sequence to an allowed symbol sequence using a trace-back depth. A trace-back depth value is a number of symbols in the received symbol sequence used by the ML decoding to identify the allowed symbol sequence from the received symbol sequence. The signal analysis unit determines one or more link statistics of the network link, and sets the trace-back depth value according to the one or more link statistics.

19 Claims, 3 Drawing Sheets

US 10,277,433 B1

METHOD TO IMPROVE LATENCY IN AN ETHERNET PHY DEVICE

FIELD OF THE DISCLOSURE

This document relates to electronic circuits for data communication networks. Some embodiments relate to circuits that improve the process of encoding and decoding data communicated using a data communication network.

BACKGROUND

Ethernet networks are widely used in industry. Some aspects of Ethernet networks are standardized by the Institute Electrical and Electronic Engineers (IEEE) 802.3 standard. Implementations of Ethernet networks can include communication or processing nodes joined by twisted pair cable as the physical network medium. The interface circuitry of a node to the network medium can be referred to as the physical layer or PHY layer of the node. A gigabit Ethernet PHY layer may employ many signal processing techniques to attain the performance required to implement the different aspects of the IEEE 802.3 standard. In an industrial Ethernet implementation, latency of communication speed can become a limiting factor as Ethernet systems strive for improved performance and scale. The present inventors have recognized a need for improved performance of Ethernet systems.

SUMMARY OF THE DISCLOSURE

This document relates generally to data communication networks, and in particular to reducing latency due to decoding data received over a data communication network. In some embodiments, physical (PHY) layer circuitry of a data communication apparatus includes transceiver circuitry, decoder circuitry, and a signal analysis unit. The transceiver circuitry receives data via a network link. The received data includes data symbols plus additive noise due to the network link. The data symbols may be encoded at the transmit source using trellis coded modulation (TCM). The decoder circuitry decodes the data symbols using a maximum-likelihood (ML) decoding method to map a received symbol sequence to an allowed symbol sequence using a trace-back depth. The trace-back depth value is a number of symbols of delay introduced by the ML decoding in identifying the most likely allowed symbol sequence. The more delay that is introduced, the more reliable the decoding decisions that are made by the decoder circuitry. The signal analysis unit determines one or more link statistics of the network link, and sets the trace-back depth value according to the one or more link statistics.

In some embodiments, a method of operating a data communications device includes receiving data via a network link of the data communications device using transceiver circuitry, wherein the received data includes data symbols encoded using trellis coded modulation (TCM); decoding the received encoded data symbols using maximum-likelihood (ML) decoding to map a received symbol sequence to an allowed symbol sequence using a trace-back depth; determining one or more link statistics of the network link; and setting the trace-back depth value for the decoder according to the one or more link statistics.

In some embodiments, a data communication apparatus includes means for receiving data via a network link, wherein the received data includes data symbols encoded using trellis coded modulation (TCM); means for decoding the received encoded data symbols using maximum-likelihood (ML) decoding to map a received symbol sequence to an allowed symbol sequence using a trace-back depth value that is a number of symbols of delay used by the ML decoding to identify the allowed symbol sequence from the received symbol sequence; means for determining one or more link statistics of the network link; and means for setting the trace-back depth value for the ML decoding according to the one or more link statistics.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
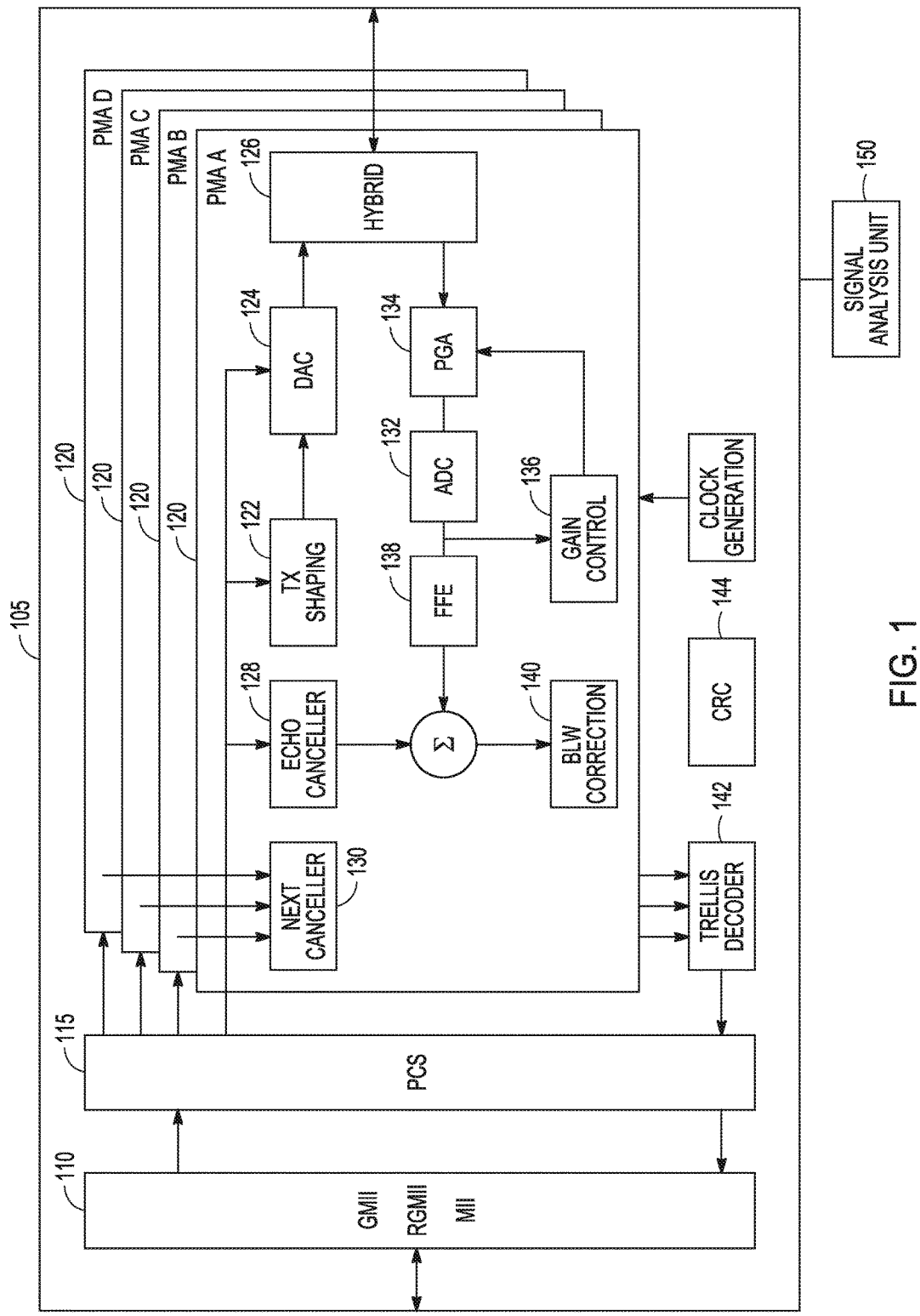
FIG. 1 is a block diagram of portions of physical layer circuitry of a node of a data communication network.

FIG. 1 is a block diagram of portions of an example of PHY layer circuitry 105, or PHY, of a communication node of a data communication network. The PHY in the example implements a 1000BASE-T IEEE 820.3 compliant interface. The PHY includes a Gigabit Media independent Interface (GMII) 110, a physical coding sub-layer (PCS) 115, and transceiver circuitry 120 that transmits and receives signals over the physical medium of the network link. The physical medium of the network can include four channels of four pairs of twisted wire cable.

The PHY can be used in conjunction with a Media Access Controller (MAC, not shown) which interfaces to the PHY via the GMII 110 or some variant of GMII (e.g., Reduced Gigabit Media. Independent interface (RGMII), MII). The MAC sends information bits over the GMII 110 that are to be transmitted on the physical medium. These bits are processed by the PCS 115 of the PHY which performs encoding function to convert the bits into a sequence of encoded four dimensional (4D) symbols each component of which is transmitted on a separate wire pair. The MAC sends data at a maximum rate of 8 bits per nominal 8 nanoseconds (8 ns) symbol period. The GMII circuitry in the PHY can include a first-in first-out (FIFO) buffer to allow for differences between the clock used by the MAC and the clock used by the PHY. Bytes of data are written to the FIFO using a symbol rate clock sourced by the MAC and are read from the FIFO using a symbol rate clock sourced by the PHY. The inter-packet gap (IPG) comprises a number of symbol periods during which the MAC does not send any data. The IPG allows the FIFO to be cleared to avoid buffer underflow or overflow.

As each 4D symbol generated by the PCS 115 can incorporate 8 information bits, the set of 4D symbols, commonly referred to as the constellation, should have at least 256 elements. In 1000BASE-T an extra bit is generated using a convolutional code and this results in a minimum constellation size of 512 elements. The encoded bits are mapped to the elements of the expanded constellation using a set partitioning technique. The combination of the convolutional encoding and the 4D symbol mapping results in a potential 5.5 decibels (5.5 dB) of coding gain relative to a symbol-by-symbol detection scheme. In 1000BASE-T, the required 512-element symbol constellation is achieved by transmitting 5-level signals on each of 4 wire pairs simultaneously (e.g., signaling levels designated as −2, −1, 0, +1, +2). This results in a 625-element constellation which allows 4D symbols that are not used for transmitting information bits to be reserved for signaling special conditions such as the start and the end of a packet.

The transceiver circuitry 120 includes four transceivers (shown as physical medium attachment, or PMA, for the four channels, PMA A-D); one for each of the four twisted wire pairs. The four 5-level signal streams that are generated by the PCS 115 are each transmitted over a separate wire pair. Prior to transmission each signal stream is passed through a transmit (TX) shaping filter 122 to reduce the high-frequency content before being processed by a digital-to-analog converter (DAC) 124. The rationale for the filtering is that at the time of development of the 1000BASE-T standard, older PHYs conforming to the 100BASE-TX standard were already widely deployed. However, 100BASE-TX uses a different encoding scheme called MLT-3 that naturally reduces the high frequency content of the transmitted signal. The transmitted signals in 1000BASE-T are filtered to ensure that their power spectrum is below that of a 100BASE-TX transmitted signal.

In 1000BASE-T the 5-level signals are transmitted and received on each wire pair simultaneously. The PHY reliably receives signals on each dimension while at the same time transmitting on that dimension. For this reason, each of the 4 transceivers PMA A-D incorporates a hybrid 126. In its simplest form the hybrid circuit can be regarded as a resistive bridge in which one of the legs of the bridge consists of the impedance seen looking in to the physical medium. If the bridge is perfectly balanced, then none of the transmitted signal should be reflected to the receiver portion of a transceiver. However, in practice it is normally not possible to achieve better than about 20 dB of attenuation between the transmit side and the receive side of the hybrid. For this reason, the PHY also includes an echo canceller 128 on each of the transceivers. The echo cancellation can be based on digital signal processing (DSP). These echo cancellers learn the characteristics of the echo path from the transmitter to the receiver during the link establishment process and they can normally attenuate the echo by at least 40 dB.

As 1000BASE-T is intended to be used over unshielded twisted pair, there is normally significant crosstalk between each pair and the other 3 pairs in the cable. The PHY can include near-end crosstalk (NEXT) cancellers 130 to mitigate this problem. Far-end crosstalk (FEXT) cancelling is not typically used.

The PHY performs most of the signal processing digitally and includes analog-to-digital converters (ADCs) 132 to convert the signals received from the physical medium. Due to power constraints, the resolution of the ADCs may be limited to nominally 8 or 9 bits of precision. This limited precision makes it desirable to effectively utilize the full dynamic range of the ADC. A programmable gain amplifier/attenuator (PGA) 134 is included to adjust the receive signal level for optimal ADC performance. The PGA can be adjusted during the link establishment process using gain control 136.

The PHY can compensate for the non-ideal frequency characteristics of the physical medium using an adaptive equalizer. This equalizer may comprise a feed-forward filter and a decision feedback filter. The feed-forward filter 138 operates on the samples received from the ADC and transforms them so that all the inter-symbol interference can be removed by the decision feedback filter. Decision feedback can include baseline wander (BLW) correction 140. BLW is an impairment which is caused by the fact that the transmitted and received signals are coupled to the wired pairs using a transformer. The transformer provides electrical isolation, but it also blocks low frequency signal content which can cause the received signal to appear to be wandering slowly. The decision feedback may be used to restore the low frequency content.

Once the received signal has been equalized it should look like the transmitted 5-level signal except with added noise. The original information bits can be recovered from the four received signals on the four channels during the decoding of the received symbols.

As explained previously, the PCS 115 may use convolution encoding to encode the 4D symbols used for communication. The convolutional encoding introduces a systematic relationship between adjacent transmitted symbols. The convolution encoder of the PCS can be thought of as a finite state machine (FSM). The state of the FSM at any point in time is dependent on the previous information bits. The transmitted symbol at any point in time is dependent both on the state of the FSM and the current information bits. In this way the FSM introduces a relationship between the transmitted symbols. This relationship may be exploited by the decoding to make more reliable decisions on a received symbol sequence. A signaling scheme such as the one described herein, in which the transmitted symbols are determined by the output of a convolutional encoder, is referred to as Trellis Coded Modulation (TCM).

Figure 2:
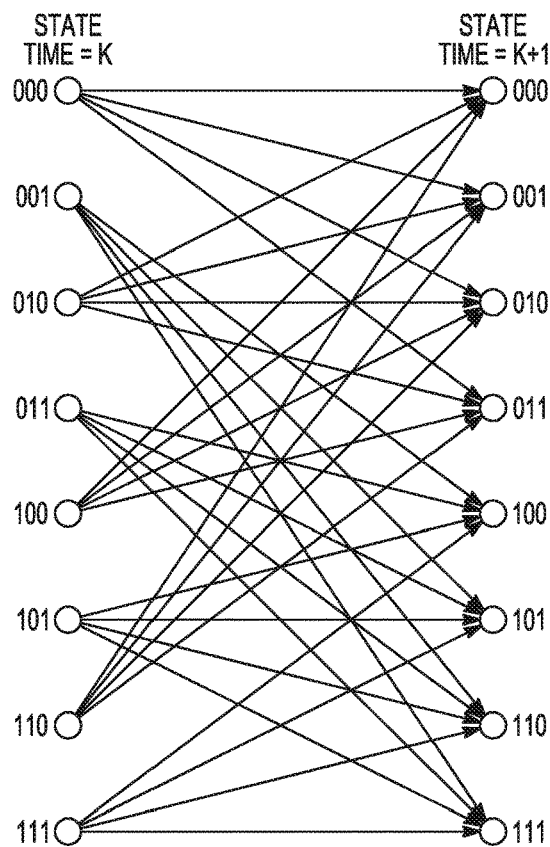
FIG. 2 is an example of a trellis diagram illustrating convolution encoding.

FIG. 2 is an example of a trellis diagram for TCM. The trellis diagram show eight states and shows the possible steps from each of the eight steps from time k to time k+1. For example, the possible transition from state 000 at time k is to one of states (000, 001, 010, 011) at time k+1. If the state is at 000 at time k+1, the previous state could only have been one of (000, 010, 100, 110) at time k. The states represent the state of the FSM of the TCM encoding and may not indicate the actual symbols output from the encoding. For an N symbol sequence, there are N time steps and multiple paths through the N time steps of the resulting trellis.

The added noise may cause errors in the symbols received by the PHY over the network link. Decoding determines the most likely transmitted symbol sequence given the noisy received symbol sequence. One approach to recover the original symbol sequence in the presence of noise is maximum-likelihood (ML) decoding, which may be performed using a Viterbi decoding algorithm. In ML decoding, probability is used to identify the most likely symbol sequence transmitted, or the most likely path through the trellis of the TCM. Probability can be used to determine the maximum likelihood path by calculating least square distances between the received symbols and the allowed symbol sequences. The calculated probabilities can be used to identify the most likely symbol sequence transmitted by tracing back through the trellis. Performing ML decoding can use a lot of the memory resources of the communication node, and the decoding delay can add latency to communication. As explained previously herein, latency of communication speed can become a limiting factor as Ethernet systems strive for improved performance and scale even for gigabit networks.

Figure 3:
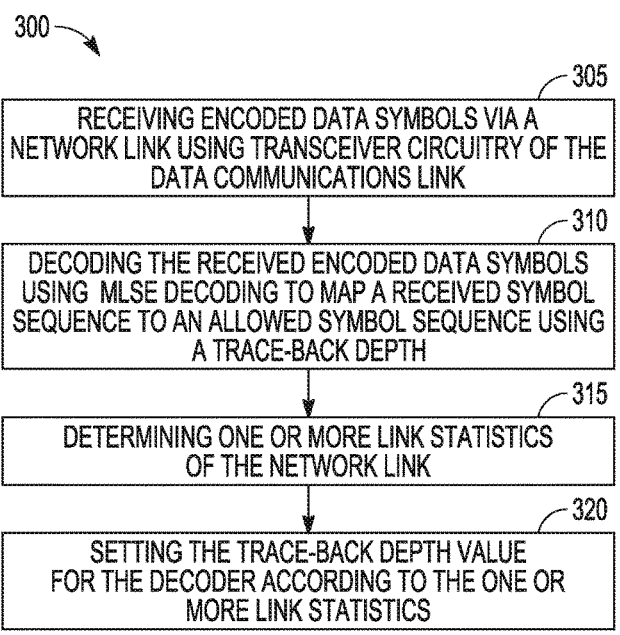
FIG. 3 is a flow diagram of a method of operating a data communications device.

FIG. 3 is a flow diagram of a method 300 of operating a data communications device such as a network node. At 305, encoded data symbols are received via a network link of the device using transceiver circuitry of the network link. The received encoded data symbols may be encoded using TCM.

At 310, the received encoded data symbols are decoded using ML decoding in which a received symbol sequence is mapped to an allowed symbol sequence using a trace-back depth. The depth of the trace-back can be the number of symbols (or the number of samples) traced back through the allowed states of the trellis of the TCM to correctly recover or identify the symbol sequence sent from the source. It is assumed that the most likely symbol sequence can be identified after tracing back through a specified number of states. However, tracing back adds a decoding delay of the number of symbols traced back. This delay is the time delay between receiving the symbol sequence and identifying the most likely allowed symbol sequence. The more delay that is inserted or introduced by the decoding, the more reliable the decoding decisions that are made by the ML decoding. The depth of the trace-back (or the number of symbols of delay) can affect the latency of the communication. For this reason, the depth of the trace-back used by the decoding circuitry is varied using the PHY according to the conditions of the network link.

At 315, one or more link statistics of the network link are determined that indicate conditions of the network link. The link statistics may be measured parameters that indicate whether the channel or channels of the link are noisy. At 320, the trace-back depth value for the ML decoding is set according to the determined link statistics.

Returning to FIG. 1, the PHY may include decoder circuitry (e.g., trellis decoder 142). The encoding circuitry of the PCS 115 may encode data symbols using TCM, and the transceiver circuitry 120 transmits the encoded data symbols via the network link. The transceiver circuitry 120 also receives encoded data symbols via the network link (e.g., by sampling and processing the signal from the network medium). The received data symbols may be encoded at the transmit source using TCM. A received symbol sequence may be the sequence of values generated by the receive circuitry of the transceiver circuitry at discrete sampling times. The decoder circuitry decodes the received encoded symbols using ML decoding and the PHY passes decoded information to the MAC. To determine the most likely symbol sequence sent from the source, the ML decoding traces back through the coding trellis and may use probability to determine the most likely symbol at a specific time step or sampling time of the trellis.

To limit the memory resources and the delay needed to identify the received symbol sequence, the depth of the trace-back through the trellis by the decoder circuitry is limited. The number of symbols by which the trace-back depth is limited can depend on the condition of the network link. The PHY includes a signal analysis unit 150 to monitor the condition of the network link. The signal analysis unit 150 determines one or more link statistics of the network link, and sets the trace-back depth value of the decoder circuitry according to the one or more link statistics. For example, if the link statistics indicate that the channels are more susceptible to errors due to noise, the signal analysis unit 150 may set the trace-back depth to a value in the range of ten to twenty symbols. If the link statistics indicate that the channels have low noise, the signal analysis unit 150 may set the trace-back depth value to as low as two symbols. If the link statistics indicate that the channels have very low noise, the trace-back depth value can be set to a value that bypasses the decoder circuitry (e.g., a trace-back depth value of zero symbols). In this way, the communication node can take advantage of a low noise environment to reduce latency in communications.

The signal analysis unit 150 can include hardware, firmware, or software or combinations of hardware, firmware, and software. The signal analysis unit 150 may include a microprocessor, a digital signal processor, or other type of processor, interpreting or executing instructions in software or firmware. The signal analysis unit 150 may include an application specific integrated circuit (ASIC) to perform the functions described. The signal analysis unit 150 may include sample and hold circuits at the inputs to the signal analysis unit 150 to monitor the network, or the signal analysis unit 150 may use sampling circuits of the transceiver circuitry 120.

The signal analysis unit 150 may determine the link statistics at the same time that arithmetic operations are being performed by the decoder circuitry to determine the received symbol sequence. In some embodiments, the signal analysis unit 150 may determine the one or more link statistics during a link startup process, or as part of an auto-negotiation performed by nodes on the link to determine communication parameters such as transmission speed or the duplex mode of the link. In some embodiments, the signal analysis unit recurrently (e.g., periodically) determines the one or more link statistics during operation of the link.

In some embodiments, the signal analysis unit 150 determines the length of a physical medium of the network link (e.g., length of a connecting cable) as the link statistic. In some variations, the signal analysis unit 150 initiates transmission of a specified signal on the network link and senses a reflection of the specified signal. The signal analysis unit 150 may determine the length of the physical medium of the network link using the time between the transmission and the received reflection. In further variations, the signal analysis unit 150 determines the power of the received signal and determines the length of a physical medium of the network link by comparing the determined power to the expected power of the transmitted signal from the link transmit partner. In still further variations, the signal analysis unit 150 initiates transmission of a specified symbol sequence on the network link. The destination of the symbol sequence may take a known fixed amount of time to respond to the specified symbol sequence. The time from transmission of the symbol sequence to receiving a response to the symbol sequence together with the known fixed response time of the destination can be used to determine the length of the physical medium of the network link.

The signal analysis unit 150 sets the value of the trace-back depth according to the determined length. The trace-back depth value can be lower for shorter lengths of the physical network medium. For example, the signal analysis unit may reduce the trace-back depth value to less than ten symbols if the signal analysis unit determines that a cable length connecting the nodes of the network is less than 100 meters. The signal analysis unit 150 may determine the trace-back depth value using a look-up table. The look-up table may be indexed using the parameter used to determine length of the network link, such as reflection time, received signal power, response time or determined length for example. The signal analysis unit 150 may determine the trace-back depth value according to thresholds of the measured parameter and one or both of the thresholds and the corresponding trace-back depth values can be programmable.

Figure 4:
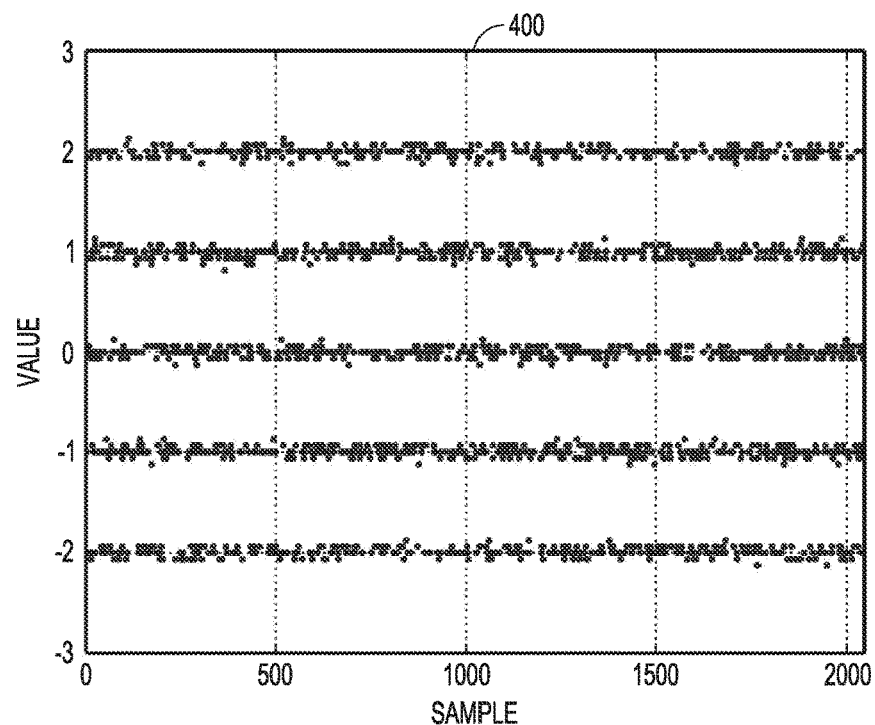
FIG. 4 is a graph of an example of a scatter plot for sampled signals of a network link.

In some embodiments, the signal analysis unit 150 produces an error signal using the samples generated by the receive circuitry of the transceiver circuitry 120, determines power of the produced error signal as the link statistic, and sets the trace-back depth value according to the determined power of the error signal. FIG. 4 is a graph 400 of an example of a scatter plot showing samples generated by the receive circuitry of the transceiver circuitry 120 in which the five signaling levels per channel (−2, −1, 0, +1, +2) are used for symbols. The dots in the graph 400 indicate the sampled values. The example in the graph 400 shows that some of the sampled signal levels are correct while some samples differ from the specified signal values. The noisier the network link, the more the sampled values will spread from the specified values.

Figure 5:
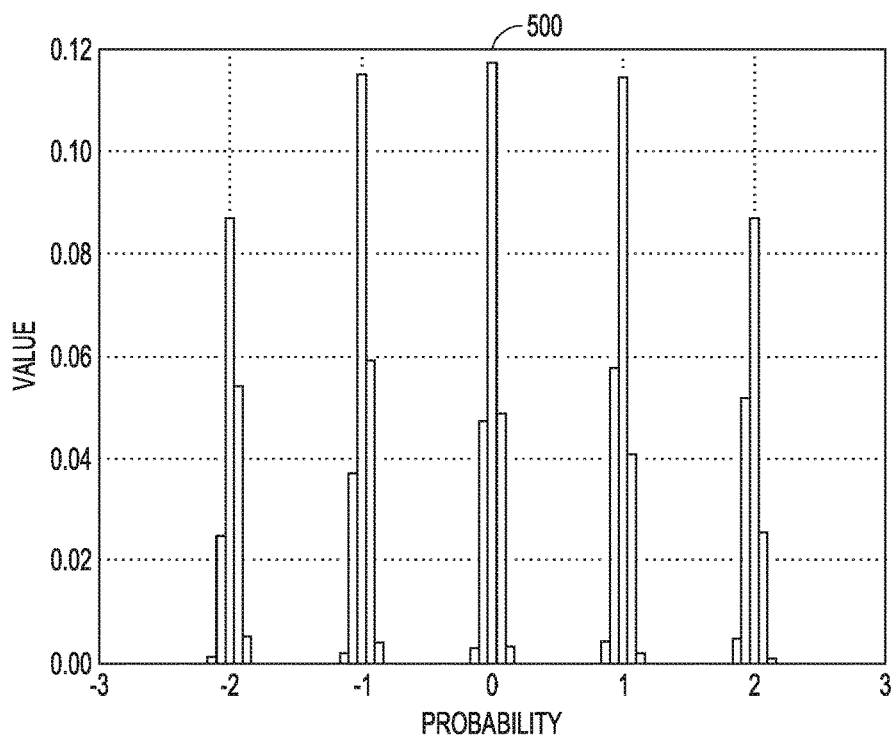
FIG. 5 is a graph showing a probability distribution of sampled signals of a network link.

FIG. 5 is a graph 500 showing the probability distribution of the sampled signal levels. The highest peak corresponds to the probability for the specified signal values of −2, −1, 0, +1, +2. The noisier the network link, the more the probabilities will spread among signal values along the x-axis. To generate the error signal, the signal analysis unit may subtract the expected signal levels from the sampled signal levels. In some variations, the signal analysis unit can determine the samples above a specified upper threshold and below a specified lower threshold. The sampled values may be analyzed for a duration of a specified measurement window. In FIG. 5, the result of subtracting the expected signal levels would be to remove the center peaks from the distributions. The signal analysis unit 150 determines the power in the error signal as the link statistic and sets the trace-back depth value according to the determined power. In further variations, the signal analysis unit 150 may determine the probability that the amplitude of the error signal is above a specified amplitude upper threshold or below a specified amplitude lower threshold. In further variations, the signal analysis unit 150 may initiate transmission of a specified sequence of symbols. Errors in the received response are determined by correlating the received symbol values to expected symbol values.

The trace-back depth value can be set to a lower number of symbols for lower determined power in the error signal. The signal analysis unit 150 may determine the trace-back depth value using a look-up table indexed by error signal power or using specified (e.g., programmed) thresholds of measured power values.

In some embodiments, the signal analysis unit 150 determines a signal-to-noise ratio (SNR) of the network link as the link statistic, and sets the trace-back depth value according to the determined SNR. In some variations, the signal analysis unit 150 determines the minimum and maximum values sampled during a measurement window and determines the SNR using the expected values and the minimum and maximum values. The trace-back depth value can be set to a higher number of symbols when the SNR is low; indicating that there is a significant amount of noise on the network link. The signal analysis unit 150 may determine the trace-back depth value using a look-up table indexed by SNR or using specified (e.g., programmed) thresholds of measured values of SNR.

The PHY includes cyclic redundancy code (CRC) check circuitry 144. Data packets from the MAC include a CRC field. The CRC field is generated on the transmit side and is used by the receiving MAC to detect whether or not there is an error in the packet. The CRC check circuitry 144 detects CRC errors in received data. In some embodiments, the signal analysis unit 150 monitors the number of CRC errors as the link statistic, and sets the value of the trace-back depth according to the number of CRC errors. For example, if the number of CRC errors exceeds a specified threshold number of CRC errors, the signal analysis unit sets the trace back depth value to a higher number of symbols. If a CRC error has not been detected for a specified period of time, the signal analysis unit may reduce the trace back depth value. The signal analysis unit 150 may determine the trace-back depth value using a look-up table indexed by the number of CRC errors or using specified thresholds of the number of CRC errors.

The trace-back depth value may be set in response to one or more link statistics being determined. The signal analysis unit 150 may set the trace back depth value at the same time that arithmetic operations are being performed by the decoder circuitry to determine the received symbol sequence, during a link startup process, during an auto-negotiation process, or during operation of the link (e.g., on the fly).

The devices and methods described herein provide a lower latency mode of operation of a network (e.g., an Ethernet network). The lower latency mode shortens the decoding operation if it is determined that the conditions of the network can tolerate the shortened decoding. These network conditions may more likely be found in space-constrained environments such as robotics or on-machine communication networks. The lower latency mode may not meet the adopted standards of such a network, but the lower latency mode may improve overall system performance Additional Description and Aspects Aspect 1 can include subject matter (such as a data communication apparatus) comprising physical (PHY) layer circuitry. The PHY layer includes transceiver circuitry, decoder circuitry, and a signal analysis unit. The transceiver circuitry receives data via a network link, wherein the received data includes data symbols encoded using trellis coded modulation (TCM). The decoder circuitry decodes the data symbols using maximum-likelihood (ML) decoding to map a received symbol sequence to an allowed symbol sequence using a trace-back depth, wherein a trace-back depth value is a number of symbols of delay used by the ML decoding in identifying the allowed symbol sequence from the received symbol sequence. The signal analysis unit configured to determine one or more link statistics of the network link, and set the trace-back depth value according to the one or more link statistics.

In Aspect 2, the subject matter of Aspect 1 optionally includes a signal analysis unit configured to determine the length of a physical medium of the network link as a link statistic, and set the trace-back depth value according to the determined length.

In Aspect 3, the subject matter of one or both of Aspects 1 and 2 optionally includes a signal analysis unit configured to produce an error signal using samples obtained by the transceiver circuitry, determine power of the produced error signal as a link statistic, and set the trace-back depth value according to the determined power of the error signal.

In Aspect 4, the subject matter of one or any combination of Aspects 1-3 optionally includes the signal analysis unit configured to determine a signal-to-noise ratio (SNR) of the network link as a link statistic, and set the trace-back depth value according to the determined SNR.

In Aspect 5, the subject matter of one or any combination of Aspects 1-4 optionally includes a cyclic redundancy code (CRC) check circuit configured to detect CRC errors in received data, and a signal analysis unit configured to monitor a number of CRC errors as a link statistic and set the trace-back depth value according to the number of CRC errors.

In Aspect 6, the subject matter of one or any combination of Aspects 1-5 optionally includes PITY layer circuitry configured to bypass the decoder circuitry according to a specified trace-back depth value.

In Aspect 7, the subject matter of one or any combination of Aspects 1-6 optionally includes a network link including multiple channels, each channel configured to receive electrical signals having two or more signaling levels, wherein the transceiver circuitry is configured to receive a multi-dimensional data symbol using the multiple channels.

In Aspect 8, the subject matter of one or any combination of Aspects 1-7 optionally includes transceiver circuitry configured to receive the encoded data symbols via the network link according to an Institute of Electrical and Electronic Engineers (IEEE) 802.3 standard.

In Aspect 9, the subject matter of one or any combination of Aspects 1-8 optionally includes a signal analysis unit configured to determine the one or more link statistics during a link startup process.

In Aspect 10, the subject matter of one or any combination of Examples 1-9 optionally includes a signal analysis unit is configured to recurrently determine the one or more link statistics during operation of the network link and set the trace-back depth value during operation of the network link.

Aspect 11 includes subject matter (such as a method comprising act to control operation of a data communications device, or a computer readable storage medium including instructions that, when performed by processing circuitry of a computing device, cause the computing device to perform the acts), or can optionally be combined with any of Aspects 1-10 to include such subject matter, comprising: receiving data via a network link of the data communications device using transceiver circuitry of the network link, wherein the received data includes data symbols encoded using trellis coded modulation (TCM); decoding the received encoded data symbols using maximum-likelihood (ML) decoding to map a received symbol sequence to an allowed symbol sequence using a trace-back depth, wherein a trace-back depth value is a number of symbols of delay used by decoder circuitry of the network link to identify the allowed symbol sequence from the received symbol sequence; determining one or more link statistics of the network link; and setting the trace-back depth value for the decoder according to the one or more link statistics.

In Aspect 12, the subject matter of Aspect 11 optionally includes determining the length of a physical medium of the network link as a link statistic of the one or more link statistics, and wherein setting the trace-back depth includes setting the trace-back depth value according to the determined length.

In Aspect 13, the subject matter of one or both of Aspects 11 and 12 optionally includes generating an error signal using the transceiver circuitry, determining power of the generated error signal as a link statistic of the one or more link statistics, and wherein setting the trace-back depth includes setting the trace-back depth value according to the determined power of the error signal.

In Aspect 14, the subject matter of one or any combination of Aspects 11-13 optionally includes determining a signal-to-noise ratio (SNR) of the network link as a link statistic of the one or more link statistics, and wherein setting the trace-back depth includes setting the trace-back depth value according to the determined. SNR.

In Aspect 15, the subject matter of one or any combination of Aspects 11-14 optionally includes determining a number of cyclic redundancy code (CRC) errors in received data as a link statistic of the one or more link statistics, and wherein setting the trace-back depth includes setting the trace-back depth value according to the number of CRC errors.

In Aspect 16, the subject matter of one or any combination of Aspects 11-15 optionally includes bypassing the decoding of data symbols when the trace-back depth has a specified bypass value.

In Aspect 17, the subject matter of one or any combination of Aspects 11-16 optionally includes encoding data symbols using TCM; transmitting encoded data symbols via the network link; and bypassing the encoding when the trace-back depth has a specified bypass value.

In Aspect 18, the subject matter of one or any combination of Aspects 11-17 optionally includes determining the network link statistic during an auto-negotiation process of the network link.

Aspect 19 includes subject matter (such as a data communications apparatus), or can optionally be combined with one or any combination of Aspects 1-18 to include such subject matter, comprising means for receiving data via a network link, wherein the received data includes data symbols encoded using trellis coded modulation (TCM); means for decoding the received encoded data symbols using maximum-likelihood (ML) decoding to map a received symbol sequence to an allowed symbol sequence using a trace-back depth, wherein a trace-back depth value is a number of symbols of delay used by the ML decoding to identify the allowed symbol sequence from the received symbol sequence; means for determining one or more link statistics of the network link; and means for setting the trace-back depth value for the MIL decoding according to the one or more link statistics.

In Aspect 20, the subject matter of Aspect 19 further includes means for determining, as the one or more link statistics, one or more of a length of a physical medium of the network link, a signal-to-noise ratio (SNR) of the network link, a power in an error signal determined using the network link, and a number of cyclic redundancy code (CRC) errors in received data.

These non-limiting Aspects can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective teems "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment. The scope of the invention should be determined with reference to the appended claims, along with the full scope of equivalents to which such claims are entitled.

What is claimed is:

1. A data communication apparatus, including physical (PHY) layer circuitry, the PHY layer circuitry comprising:
    transceiver circuitry configured to receive data via a network link, wherein the received data includes data symbols encoded using trellis coded modulation (TCM);
    decoder circuitry configured to decode the data symbols using maximum-likelihood (ML) decoding to map a received symbol sequence to an allowed symbol sequence using a trace-back depth, wherein a trace-back depth value is a number of symbols of delay used by the ML decoding in identifying the allowed symbol sequence from the received symbol sequence; and
    a signal analysis unit configured to determine length of a physical medium of the network link as a link statistic, and set the trace-back depth value according to one or more link statistics including the determined length.

2. The data communications apparatus of claim 1, wherein the signal analysis unit is configured to produce an error signal using samples obtained by the transceiver circuitry, determine power of the produced error signal as a link statistic, and set the trace-back depth value according to the determined power of the error signal.

3. The data communications apparatus of claim 1, wherein the signal analysis unit is configured to determine a signal-to-noise ratio (SNR) of the network link as a link statistic, and set the trace-back depth value according to the determined SNR.

4. The data communications apparatus of claim 1, including a cyclic redundancy code (CRC) check circuit configured to detect CRC errors in received data, wherein the signal analysis unit is configured to monitor a number of CRC errors as a link statistic and set the trace-back depth value according to the number of CRC errors.

5. The data communications apparatus of claim 1, wherein the PHY layer circuitry is configured to bypass the decoder circuitry according to a specified trace-back depth value.

6. The data communication apparatus of claim 1, wherein the network link includes multiple channels; each channel configured to receive electrical signals having two or more signaling levels, wherein the transceiver circuitry is configured to receive a multi-dimensional data symbol using the multiple channels.

7. The data communication apparatus of claim 1, wherein the transceiver circuitry is configured to receive the encoded data symbols via the network link according to an Institute of Electrical and Electronic Engineers (IEEE) 802.3 standard.

8. The data communication apparatus of claim 1, wherein the signal analysis unit is configured to determine the one or more link statistics during a link startup process.

9. The data communication system of claim 1, wherein the signal analysis unit is configured to recurrently determine the one or more link statistics during operation of the network link and set the trace-back depth value during operation of the network link.

10. A method of operating a data communications device, the method comprising:
    receiving data via a network link of the data communications device using transceiver circuitry of the network link, wherein the received data includes data symbols encoded using trellis coded modulation (TCM);
    decoding the received encoded data symbols using maximum-likelihood (ML) decoding to map a received symbol sequence to an allowed symbol sequence using a trace-back depth, wherein a trace-back depth value is a number of symbols of delay used by decoder circuitry of the network link to identify the allowed symbol sequence from the received symbol sequence;
    determining length of a physical medium of the network link as a link statistic; and
    setting the trace-back depth value for the decoder according to one or more link statistics including the determined length.

11. The method of claim 10, including determining the one or more link statistics during operation of the network link and setting the trace-back depth value during operation of the network link.

12. The method of claim 10, including: generating an error signal using the transceiver circuitry, determining power of the generated error signal as a link statistic of the one or more link statistics, and wherein setting the trace-back depth includes setting the trace-back depth value according to the determined power of the error signal.

13. The method of claim 10, including determining a signal-to-noise ratio (SNR) of the network link as a link statistic of the one or more link statistics, and wherein setting the trace-back depth includes setting the trace-back depth value according to the determined SNR.

14. The method of claim 10, including determining a number of cyclic redundancy code (CRC) errors in received data as a link statistic of the one or more link statistics, and wherein setting the trace-back depth includes setting the trace-back depth value according to the number of CRC errors.

15. The method of claim 10, including bypassing the decoding of data symbols when the trace-back depth has a specified bypass value.

16. The method of claim 10, including encoding data symbols using TCM; transmitting encoded data symbols via the network link; and bypassing the encoding when the trace-back depth has a specified bypass value.

17. The method of claim 10, wherein determining the network link statistic includes determining the network link statistic during an auto-negotiation process of the network link.

18. A data communication apparatus comprising:
 means for receiving data via a network link, wherein the received data includes data symbols encoded using trellis coded modulation (TCM);
 means for decoding the received encoded data symbols using maximum-likelihood (ML) decoding to map a received symbol sequence to an allowed symbol sequence using a trace-back depth, wherein a trace-back depth value is a number of symbols of delay used by the ML decoding to identify the allowed symbol sequence from the received symbol sequence;
 means for determining length of a physical medium of the network link as a link statistic; and
 means for setting the trace-back depth value for the ML decoding according to to one or more link statistics including the determined length.

19. The data communication apparatus of claim 18, further including means for determining, as the one or more link statistics, one or more of a signal-to-noise ratio (SNR) of the network link, a power in an error signal determined using the network link, and a number of cyclic redundancy code (CRC) errors in received data.

\* \* \* \* \*